United States Patent
Yun et al.

(10) Patent No.: US 10,026,546 B2
(45) Date of Patent: Jul. 17, 2018

(54) APPARATUS WITH 3D WIREWOUND INDUCTOR INTEGRATED WITHIN A SUBSTRATE

(71) Applicant: QUALCOMM Incorporated, San Diego, CA (US)

(72) Inventors: Changhan Hobie Yun, San Diego, CA (US); Chengjie Zuo, San Diego, CA (US); Daeik Daniel Kim, Del Mar, CA (US); Mario Francisco Velez, San Diego, CA (US); Niranjan Sunil Mudakatte, San Diego, CA (US); Jonghae Kim, San Diego, CA (US); David Francis Berdy, San Diego, CA (US)

(73) Assignee: QUALCOMM Incorported, San Diego, CA (US)

( * ) Notice: Subject to any disclaimer, the term of this patent is extended or adjusted under 35 U.S.C. 154(b) by 95 days.

(21) Appl. No.: 15/160,776

(22) Filed: May 20, 2016

(65) Prior Publication Data

US 2017/0338034 A1    Nov. 23, 2017

(51) Int. Cl.
| | |
|---|---|
| *H03H 7/46* | (2006.01) |
| *H01F 27/40* | (2006.01) |
| *H01F 27/28* | (2006.01) |
| *H01F 27/29* | (2006.01) |
| *H01F 41/02* | (2006.01) |
| *H03H 7/01* | (2006.01) |

(52) U.S. Cl.
CPC ......... *H01F 27/40* (2013.01); *H01F 27/2823* (2013.01); *H01F 27/29* (2013.01); *H01F 41/02* (2013.01); *H03H 7/0115* (2013.01); *H03H 7/466* (2013.01)

(58) Field of Classification Search
CPC ...... H01F 27/40; H01F 27/2823; H01F 27/29; H01F 41/02; H03H 7/0115; H03H 7/466
USPC ......................................................... 333/132
See application file for complete search history.

(56) References Cited

U.S. PATENT DOCUMENTS

| | | | |
|---|---|---|---|
| 5,372,967 A | 12/1994 | Sundaram et al. | |
| 7,148,553 B1 | 12/2006 | Davies | |
| 7,621,036 B2 * | 11/2009 | Cros ................ | A61B 5/0215 205/122 |
| 8,339,233 B2 | 12/2012 | Tsai et al. | |
| 8,742,539 B2 | 6/2014 | Weyers et al. | |
| 8,754,737 B2 | 6/2014 | Sin et al. | |

(Continued)

FOREIGN PATENT DOCUMENTS

| | | |
|---|---|---|
| EP | 2079290 A2 | 7/2009 |
| JP | 2001176728 A | 6/2001 |

(Continued)

OTHER PUBLICATIONS

International Search Report and Written Opinion—PCT/US2017/028547—ISA/EPO—dated Jul. 7, 2017.

(Continued)

*Primary Examiner* — Robert J Pascal
*Assistant Examiner* — Kimberly Glenn
(74) *Attorney, Agent, or Firm* — Qualcomm Incorporated-Toler

(57) ABSTRACT

An apparatus includes a substrate and a three-dimensional (3D) wirewound inductor integrated within the substrate. The apparatus further includes a capacitor coupled to the 3D wirewound inductor.

28 Claims, 6 Drawing Sheets

(56) References Cited

U.S. PATENT DOCUMENTS

| | | |
|---|---|---|
| 9,159,778 B2 | 10/2015 | Wang et al. |
| 9,265,158 B2 | 2/2016 | Mano et al. |
| 2006/0290457 A1 | 12/2006 | Lee et al. |
| 2008/0135977 A1 | 6/2008 | Meyer et al. |
| 2014/0104288 A1 | 4/2014 | Shenoy et al. |
| 2014/0110822 A1 | 4/2014 | Weyers et al. |
| 2014/0197902 A1 | 7/2014 | Zuo et al. |
| 2014/0225706 A1 | 8/2014 | Doyle et al. |
| 2014/0268615 A1 | 9/2014 | Yun et al. |
| 2014/0354378 A1 | 12/2014 | Zuo et al. |
| 2015/0228416 A1 | 8/2015 | Hurwitz et al. |

FOREIGN PATENT DOCUMENTS

| | | |
|---|---|---|
| JP | 2002344146 A | 11/2002 |
| JP | 2005159514 A | 6/2005 |
| JP | 2009229261 A | 10/2009 |
| JP | 2010287684 A | 12/2010 |
| JP | 2011124373 A | 6/2011 |
| KR | 20080086712 A | 9/2008 |

OTHER PUBLICATIONS

Liu, K., et al., "Fabrication and Analytical Evaluation of Three-Dimensional Microsolenoids Achieved in Fused Silica by Femtosecond-Laser-based Microsolidifying Process," Micro & Nano Letters, 2013, vol. 8, Issue 10, Institution of Engineering and Technology, London, England, pp. 623-628.

"Schott HermeS®—Hermetic Through Glass Vias (TGV) for reliable and miniaturized packaging of sensitive MEMS devices," Nov. 3, 2014, Schott AG, Mainz, Germany, 2 Pages.

\* cited by examiner

APPARATUS WITH 3D WIREWOUND INDUCTOR INTEGRATED WITHIN A SUBSTRATE

I. FIELD

This disclosure is generally related to electronic devices and more particularly to inductors.

II. DESCRIPTION OF RELATED ART

Integrated circuits and other electronic devices may include inductors, capacitors, and other components. An inductor may generate a magnetic field in response to a current.

Certain integrated circuits and other devices include inductors formed using vias. For example, metal vias may be formed in a substrate, and the metal vias may be connected using a trace. The metal vias and the trace may form a "U" shape that functions as an inductor by generating a magnetic field in response to a current.

Inductors formed using vias and traces utilize circuit area of an integrated circuit. For example, surface area of an integrated circuit may be used to form the traces that connect the vias. The traces reduce surface area of the integrated circuit available to other device components of the integrated circuit. Further, processes used to form the vias and traces incur fabrication cost.

III. SUMMARY

A device in accordance with the disclosure may include one or more three-dimensional (3D) wirewound inductors formed within a substrate. The 3D wirewound inductor may include one or more coils having a circular shape or a substantially circular shape. The substrate may be formed "around" the one or more 3D wirewound inductors, such as using a molding process. In an illustrative example, the device also includes a capacitor coupled to the 3D wirewound inductor. For example, the 3D wirewound inductor and the capacitor may be included in a radio frequency (RF) device, such as a diplexer (DPX) circuit, as an illustrative example.

By integrating the one or more 3D wirewound inductors within the substrate, a number of metal traces of the device may be reduced as compared to a device that uses vias and traces to form an inductor. As a result, certain device components may be formed on (or "stacked" on) an inductor, increasing circuit area density of the device. For example, an inductive-capacitive (LC) filter may include a 3D wirewound inductor integrated within a substrate and may further include a capacitor formed above the 3D wirewound inductor (e.g., instead of using a first surface area of a substrate for an inductor and a second surface area of the substrate for a capacitor). Further, a quality factor (Q factor) of a wirewound inductor that includes one or more substantially circular coils may be greater than a Q factor of inductors formed using substantially straight components (e.g., vias and traces), enhancing device performance.

In an illustrative example, an apparatus includes a substrate. The apparatus further includes a 3D wirewound inductor integrated within the substrate. The apparatus further includes a capacitor coupled to the 3D wirewound inductor.

In another example, an apparatus includes a substrate and a 3D wirewound inductor integrated within the substrate. The apparatus further includes a capacitor coupled to the 3D wirewound inductor and a radio frequency (RF) circuit that includes the 3D wirewound inductor and the capacitor.

In another example, an apparatus includes means for conducting a signal through a set of one or more wirewound coils to generate a magnetic field. The means for conducting is integrated within a substrate. The apparatus further includes means for storing charge. The means for storing charge is coupled to the means for conducting the signal.

In another example, a method of fabrication of a device includes forming a substrate around one or more 3D wirewound inductors. The method further includes thinning one or more sides of the substrate to expose one or more terminals of the one or more 3D wirewound inductors.

One particular advantage provided by at least one of the disclosed examples is a reduced number of traces formed at a surface of a substrate. As a result, one or more device components may be formed above (or "stacked" on) an inductor, increasing circuit area density of a device. Further, a Q factor of a wirewound inductor may be greater than a Q factor of inductors formed using substantially straight components (e.g., vias and traces), enhancing device performance. Another benefit of at least one of the disclosed examples is reduced manufacturing cost to form an inductor. For example, a number of vias through a substrate may be reduced, thus reducing or eliminating certain drilling and metallization operations. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Certain examples are described below with reference to the drawings. In the description and the drawings, similar or common features are indicated by common reference numbers.

Figure 1:
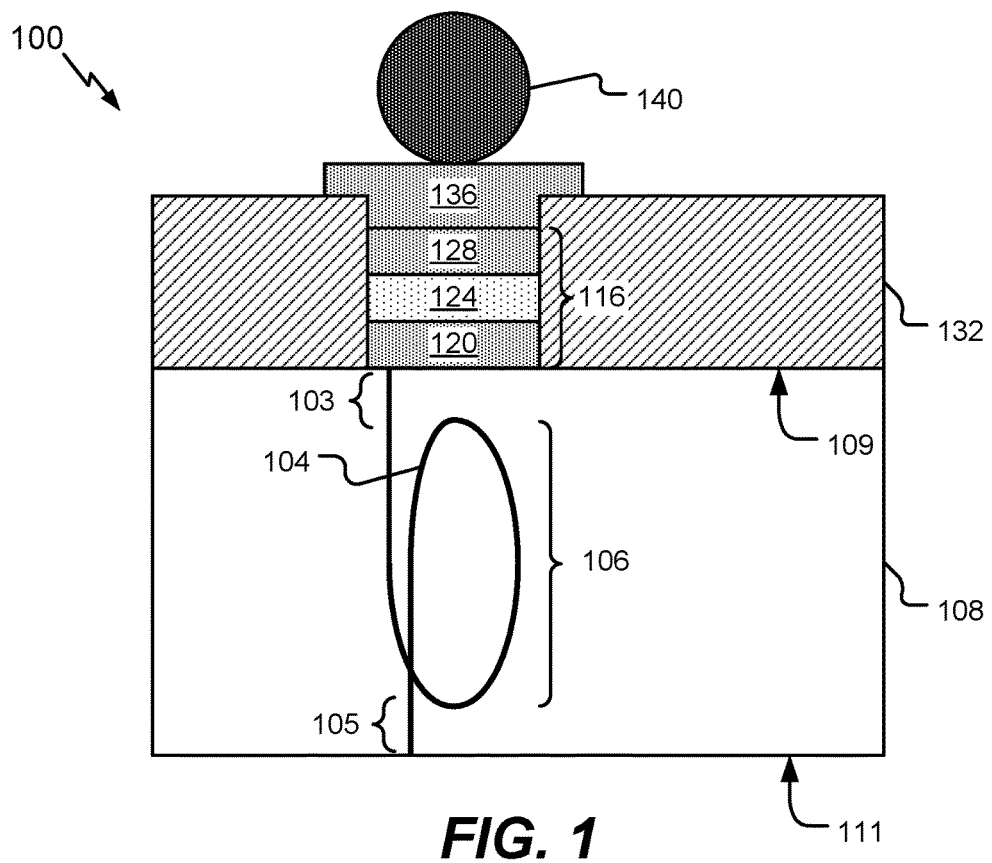
FIG. 1 depicts an illustrative example of a device including a substrate and a 3D wirewound inductor integrated within the substrate.

FIG. 1 depicts an illustrative example of a device 100, such as an integrated circuit (IC) or a hybrid integrated circuit (HIC). The device 100 includes a three-dimensional (3D) wirewound inductor 104 disposed within (e.g., embedded within) a substrate 108. The device 100 may have a passive-on-glass (PoG) configuration.

The 3D wirewound inductor 104 may have a monolithic configuration and may be formed from a single material (e.g., instead of using vias and traces that are formed in multiple steps of lithography and metal deposition). The 3D wirewound inductor 104 may include a metal material, such as copper or tungsten, as illustrative examples.

The 3D wirewound inductor 104 includes one or more coils, such as a coil 106. The coil 106 may be disposed between a first surface 109 of the substrate 108 and a second surface 111 of the substrate 108 (e.g., below the first surface 109 and above the second surface 111). As used herein, "wirewound" may refer to an inductor (e.g., the 3D wirewound inductor 104) including one or more coils (e.g., the coil 106) having a circular shape or a substantially circular shape (e.g., an elliptical shape or a "spring" shape). For example, "wirewound" may refer to an inductor having a helical configuration. An extent of the 3D wirewound inductor 104 may have a radius that is constant or substantially constant. For example, a cross section of the "wire" of the 3D wirewound inductor 104 may have a constant or substantially constant dimension (as compared to certain inductors that include vias having one cross sectional dimension and traces having another cross section dimension).

The 3D wirewound inductor 104 may include a first terminal 103 and a second terminal 105. The first terminal 103 and the second terminal 105 may each include a portion of a wire forming the 3D wirewound inductor 104. It should be appreciated that the first terminal 103, the second terminal 105, and the coil 106 may have a monolithic (or unitary) configuration.

The substrate 108 may include a glass material or a semiconductor material, as illustrative, non-limiting examples. The substrate 108 may be a monolithic substrate having a monolithic configuration (e.g., the substrate 108 may include a single layer instead of multiple layers). In an illustrative example, the substrate 108 is formed around the 3D wirewound inductor 104 using a monolithic process, such as using a molding process that molds material of the substrate 108 around the 3D wirewound inductor 104. The substrate 108 may correspond to a molded substrate having a molded configuration.

The device 100 may also include one or more components formed above the 3D wirewound inductor 104. For example, the device 100 may include a capacitor 116, such as a metal-insulator-metal (MIM) capacitor that is formed above (e.g., that is stacked on) the 3D wirewound inductor 104. The capacitor 116 may include a first metal region 120, a second metal region 128, and an insulator region 124 that is in contact with the first metal region 120 and the second metal region 128. The capacitor 116 may have a planar configuration and may be in contact with the 3D wirewound inductor 104 at the first surface 109 of the substrate 108. In an illustrative implementation, the 3D wirewound inductor 104 and the capacitor 116 are included in a radio frequency (RF) device, such as an oscillator circuit, a filter circuit, a hybrid circuit, a diplexer (DPX) circuit, or an RF receiver front-end circuit, as illustrative examples.

The device 100 may further include a layer 132, such as an interlayer dielectric (ILD). FIG. 1 also illustrates that the device 100 may include a conductive region 136, such as a via and a contact formed using a dual damascene process, as an illustrative example. The conductive region 136 and the layer 132 may adjoin the capacitor 116.

The device 100 may also include a connector structure, such as a bump 140 (e.g., a flip chip bump). In some implementations, the device 100 may be coupled to another device via the bump 140. For example, an integrated circuit including the device 100 may be coupled to another integrated circuit, such as in connection with a system-in-package (SiP) configuration. Alternatively or in addition, the device 100 may be coupled to a substrate of a package via the bump 140. In another example, the device 100 may be coupled to a printed circuit board (PCB) via the bump 140. To illustrate, in some cases, the device 100 may be included within an interposer device, such as a glass interposer device that is configured to couple to an integrated circuit and a PCB. In this case, the device 100 may be configured to couple to an integrated circuit or a PCB via the bump 140.

During operation, the 3D wirewound inductor 104 may receive a signal and may generate a magnetic field based on the signal. For example, in some implementations, the capacitor 116 may provide the signal to the 3D wirewound inductor 104 (e.g., during charging of the capacitor 116, during discharging of the capacitor 116, or both). The capacitor 116 may receive a signal from or may provide a signal to another component via the bump 140.

In another example, the 3D wirewound inductor 104 may receive a signal from a component that is coupled to the second terminal 105 of the 3D wirewound inductor 104 (e.g., to generate a magnetic field in response to the signal). The 3D wirewound inductor 104 may provide a signal to the capacitor 116 based on inductive reactance of the 3D wirewound inductor 104 (e.g., by generating the signal in response to a magnetic field generated by the 3D wirewound inductor 104). In some implementations, the 3D wirewound inductor 104 and the capacitor 116 may correspond to an inductive-capacitive (LC) circuit (e.g., a "tank" circuit) that oscillates based on a particular frequency (e.g., a resonant frequency) during operation of the device 100.

Integrating the 3D wirewound inductor 104 within the substrate 108 may free circuit area of the device 100 for one or more other components. For example, the 3D wirewound inductor 104 may be fabricated without using a trace to connect through glass vias (TGVs), which may enable one or more components (e.g., the capacitor 116) to be formed above the 3D wirewound inductor 104. Further, use of an inductor having one or more circular or substantially circular coils may improve a quality factor (Q factor) as compared to relatively "straight" inductors, such as an inductor that includes TGVs and a trace connected at right angles.

Figure 2:
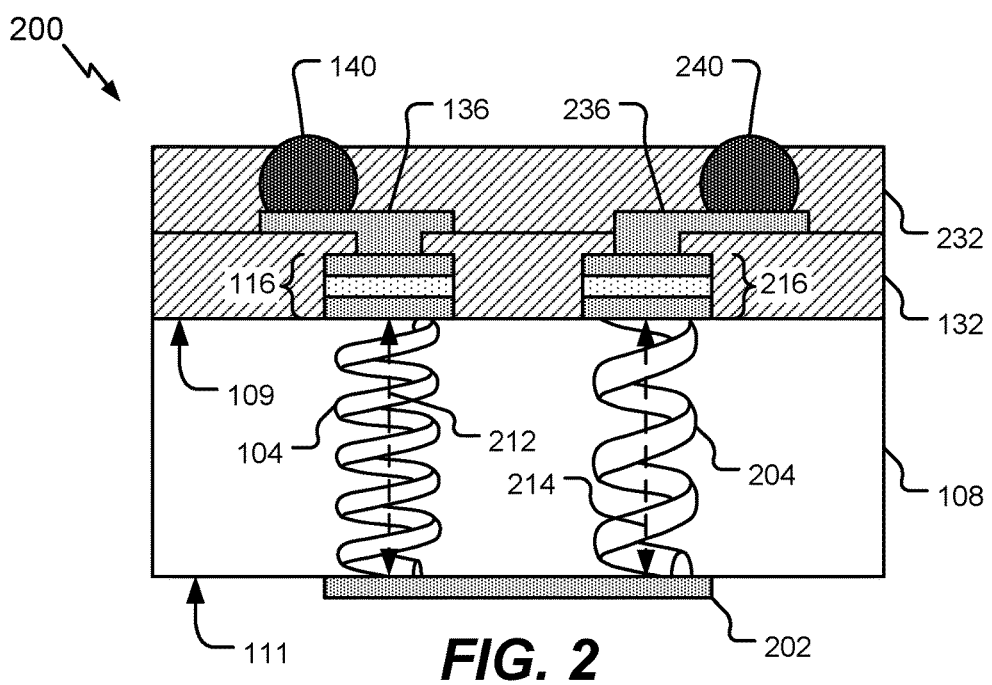
FIG. 2 depicts another illustrative example of a device including a substrate and a 3D wirewound inductor integrated within the substrate.

FIG. 2 depicts an illustrative example of a device 200. One or more features of the device 200 may be as described with reference to the device 100 of FIG. 1. For example, the device 200 includes the 3D wirewound inductor 104 disposed within (e.g., embedded within) the substrate 108. As additional examples, the device 200 may include the capacitor 116, the layer 132, the conductive region 136, and the bump 140.

In the example of FIG. 2, the device 200 further includes a second 3D wirewound inductor 204. The 3D wirewound inductors 104, 204 each include multiple coils that are integrated within the substrate 108.

A coil of a wirewound inductor integrated within the substrate 108 may be disposed around an axis that extends from the first surface 109 to the second surface 111. For example, the 3D wirewound inductor 104 may include a set of one or more coils disposed around an axis 212 that extends from the first surface 109 to the second surface 111.

As another example, the second 3D wirewound inductor 204 may include a second set of one or more coils disposed around an axis 214 that extends from the first surface 109 to the second surface 111.

In an illustrative example, one or both of the 3D wirewound inductors 104, 204 may be associated with an inductance that is between 0.5 nanohenries (nH) and 8 nH or between 1 nH and 10 nH. In some examples, each 1 millimeter (mm) portion of the 3D wirewound inductors 104, 204 may be associated with an inductance of approximately 0.8 nH. In an illustrative example, a height (H) of the substrate 106 (or the 3D wirewound inductors 104, 204) may be approximately 0.3 mm and a diameter (D) of the 3D wirewound inductors 104, 204 may be approximately 0.3, which may result in a length of approximately 1.8 mm per turn of the 3D wirewound inductors 104, 204. In this example, an inductance of one or both of the 3D wirewound inductors 104, 204 may be approximately 1.5 nH. A diameter (D) and a number of turns (T) of one or both of the 3D wirewound inductors 104, 204 may be selected to achieve a particular inductance of one or both of the 3D wirewound inductors 104, 204.

Table 1 illustrates certain examples of L (inductance of one or both of the 3D wirewound inductors 104, 204), D (diameter of one or both of the 3D wirewound inductors 104, 204), H (height of one or more of the 3D wirewound inductors 104, 204 or the substrate 108), and T (a number of turns of one or both of the 3D wirewound inductors 104, 204). It should be appreciated that the example of Table 1 is illustrative and that other examples are also within the scope of the disclosure.

TABLE 1

| L (nH) | D (mm) | H (mm) | T |
|---|---|---|---|
| 1 | 0.2 | 0.3 | 1 |
| 3 | 0.3 | 0.3 | 2 |
| 6 | 0.3 | 0.3 | 4 |
|  | 0.4 | 0.3 | 3 |
| 9 | 0.3 | 0.3 | 6 |
|  | 0.6 | 0.3 | 3 |

In some implementations, a thickness (e.g., a radius (R) of a cross-section) of one or both of the 3D wirewound inductors 104, 204 is between 80 micrometers (μm) and 200 μm. In an illustrative example, one or more of L, D, H, T, and R are selected to enable a Q factor of one or both of the 3D wirewound inductors 104, 204 of at least 80 for an illustrative 1 gigahertz (GHz) application and at least 130 for an illustrative 2 GHz application in connection with inductance values of between 1 nH and 10 nH.

FIG. 2 also depicts that the 3D wirewound inductor 104 may include a first number of coils (e.g., five coils, as an illustrative example) and that the second 3D wirewound inductor 204 may include a second number of coils (e.g., three-and-a-half coils, as an illustrative example) that is different than the first number of coils. For example, the 3D wirewound inductor 104 may include five coils, and the second 3D wirewound inductor 204 may include three-and-a-half coils. The first number of coils may enable a first inductance of the 3D wirewound inductor 104, and the second number of coils may enable a second inductance of the second 3D wirewound inductor 204. For example, if the first number of coils is greater than the second number of coils, the 3D wirewound inductor 104 may be associated with a greater inductance than the second 3D wirewound inductor 204.

The device 200 may also include one or more components formed above the second 3D wirewound inductor 204. For example, the device 200 may include a second capacitor 216, such as a MIM capacitor that is formed above (e.g., that is stacked on) the second 3D wirewound inductor 204. The second capacitor 216 may include a first metal region, a second metal region, and an insulator region that is in contact with the first metal region and the second metal region. The second capacitor 216 may have a planar configuration and may be in contact with the second 3D wirewound inductor 204 at the first surface 109 of the substrate 108. In an illustrative implementation, one or more of the 3D wirewound inductor 104, the second 3D wirewound inductor 204, the capacitor 116, and the second capacitor 216 are included in a radio frequency (RF) device, such as an oscillator circuit, a filter circuit, a hybrid circuit, a diplexer (DPX) circuit, or an RF receiver front-end circuit, as illustrative examples. In some implementations, one or both of the capacitors 116, 216 have a capacitance of between 1 picofarad (pF) and 10 pF.

In an illustrative implementation, the 3D wirewound inductor 104 and the capacitor 116 may be included within a first receiver signal chain, and the second 3D wirewound inductor 204 and the second capacitor 216 may be included within a second receiver signal chain. The first receiver signal chain may be associated with a first frequency range, and the second receiver signal chain may be associated with a second frequency range. The first frequency range may be different than (e.g., may overlap with, may be non-overlapping with, may include, or may be included in) the second frequency range. As a non-limiting illustrative example, the first frequency range may be approximately 1710 to 2690 megahertz (MHz) (e.g., a high-band (HB) frequency range), and the second frequency range may be approximately 699 to 960 MHz (e.g., a low-band (LB) frequency range). The first receiver signal chain may be included in a cellular receiver, and the second receiver signal chain may be included in a Wi-Fi receiver, as illustrative examples.

In an illustrative application, the 3D wirewound inductor 104 and the capacitor 116 form a first oscillator circuit associated with a first frequency of oscillation that is based in part on a first number of coils of the 3D wirewound inductor 104. The second 3D wirewound inductor 204 and the second capacitor 216 may form a second oscillator circuit associated with a second frequency of oscillation that is based in part on a second number of coils of the second 3D wirewound inductor 204.

The device 200 may further include a second layer 232, such as a second interlayer dielectric (ILD). FIG. 2 also illustrates that the device 200 may include a second conductive region 236, such as a via and a contact formed using a dual damascene process, as an illustrative example. The second conductive region 236 and the second layer 232 may adjoin the second capacitor 216. The device 200 may also include a second connector structure, such as a second bump 240 (e.g., a flip chip bump).

The 3D wirewound inductor 104 may be coupled to the second 3D wirewound inductor 204. For example, the 3D wirewound inductor 104 may be coupled to the second 3D wirewound inductor 204 via a layer 202, such as a redistribution layer (RDL). Depending on the particular implementation, the 3D wirewound inductor 104 may be coupled to the second 3D wirewound inductor 204 in series or in parallel. In an alternative implementation, the 3D wirewound inductor 104 may not be electrically coupled to the second 3D wirewound inductor 204. In some implementations, the 3D wirewound inductor 104 may be magnetically coupled to the second 3D wirewound inductor 204 (e.g., in a transformer implementation).

The example of FIG. 2 illustrates that the substrate 108 may include multiple 3D wirewound inductors, such as the 3D wirewound inductor 104 and the second 3D wirewound inductor 204. Further, a number of coils of an inductor integrated within the substrate 108 may be selected to enable a particular inductance or a particular frequency of operation, such as a particular frequency band associated with a wireless application.

Figure 3:
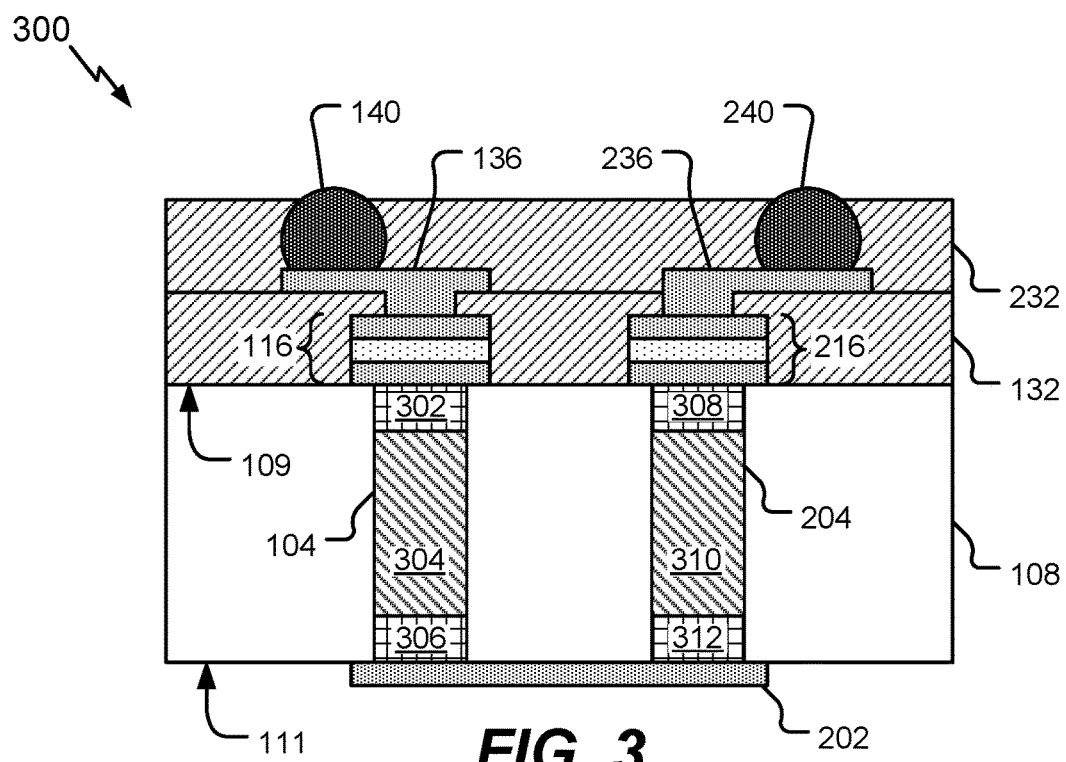
FIG. 3 depicts another illustrative example of a device including a substrate and a 3D wirewound inductor integrated within the substrate.

FIG. 3 depicts an illustrative example of a device 300. One or more features of the device 300 may be as described with reference to the device 100 of FIG. 1, the device 200 of FIG. 2, or both. For example, the device 300 includes the 3D wirewound inductor 104 and the second 3D wirewound inductor 204 disposed within (e.g., embedded within) the substrate 108. As additional examples, the, device 300 may include the capacitor 116, the second capacitor 216, the layer 132, the second layer 232, the conductive region 136, the second conductive region 236, the bump 140, and the second bump 240.

In the example of FIG. 3, the 3D wirewound inductor 104 and the second 3D wirewound inductor 204 have a surface-mount technology (SMT) configuration. For example, the 3D wirewound inductor 104 and the second 3D wirewound inductor 204 may be mountable to the surface of a device, such as the surface of a printed circuit board (PCB). In the example of FIG. 3, the 3D wirewound inductors 104, 204 may include (or may be integrated within) casings 304, 310 (e.g., casings to isolate the 3D wirewound inductors 104, 204 from other components on a PCB). The first terminal 103 of FIG. 1 may be integrated within a casing 302, and the second terminal 105 of FIG. 1 may be integrated within a casing 306. A first terminal of the second 3D wirewound inductor 204 may be integrated within a casing 308, and a second terminal of the second 3D wirewound inductor 204 may be integrated within a casing 312.

The example of FIG. 3 may reduce fabrication cost associated with integrating inductors having casings within a substrate. For example, instead of stripping one or more of the casings 302-312 from the 3D wirewound inductors 104, 204 prior to integrating the 3D wirewound inductors 104, 204 within the substrate 108, one or more of the casings 302-312 may remain on (or may be left on) the 3D wirewound inductors 104, 204. Leaving one or more of the casings 302-312 on the 3D wirewound inductors 104, 204 may reduce or eliminate fabrication cost associated with stripping one or more of the casings 302-312.

Figure 4:
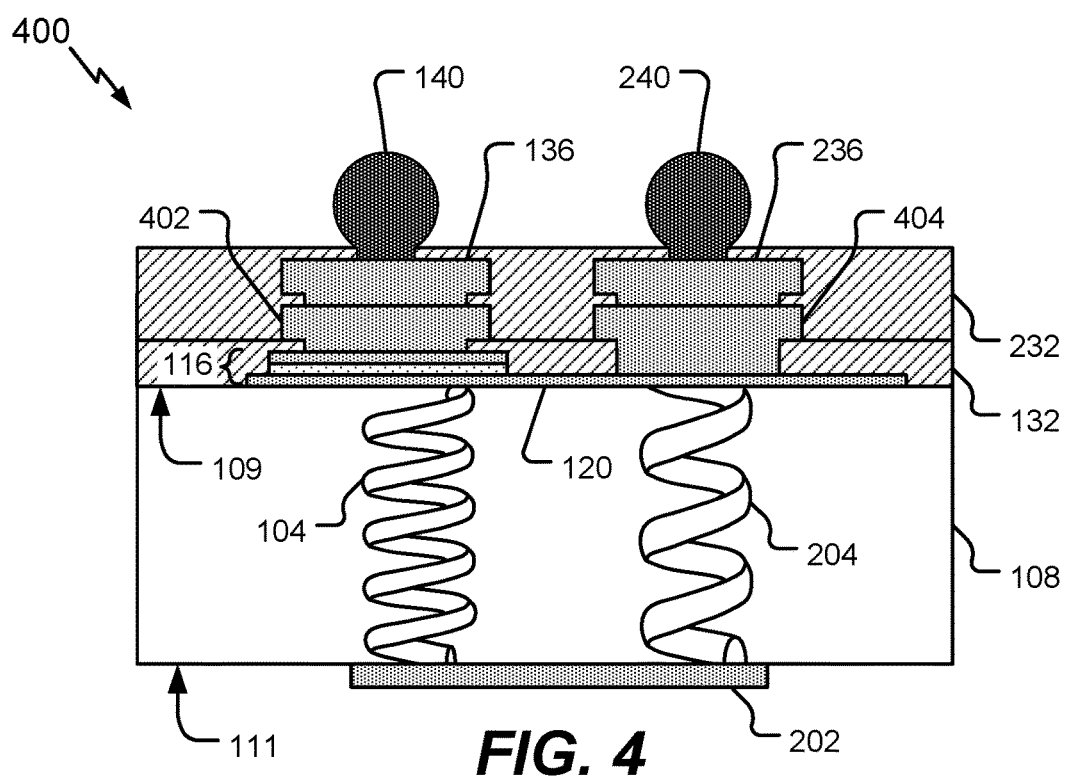
FIG. 4 depicts another illustrative example of a device including a substrate and a 3D wirewound inductor integrated within the substrate.

FIG. 4 depicts an illustrative example of a device 400. One or more features of the device 400 may be as described with reference to the device 100 of FIG. 1, the device 200 of FIG. 2, the device 300 of FIG. 3, or a combination thereof. For example, the device 400 includes the 3D wirewound inductor 104 and the second 3D wirewound inductor 204 disposed within (e.g., embedded within) the substrate 108. As additional examples, the, device 400 may include the capacitor 116, the layer 132, the second layer 232, the conductive region 136, the second conductive region 236, the bump 140, and the second bump 240.

The device 400 may further include one or more two-dimensional (2D) inductors, such as a 2D inductor 402 and a second 2D inductor 404. The 2D inductors 402, 404 may be formed above (e.g., stacked on) the 3D wirewound inductors 104, 204. The 2D inductors 402, 404 may have a planar configuration. For example, the 2D inductors 402, 404 may each include one or more conductive loops formed using one or more of an etching process, a deposition process, a patterning process, a metallization process, or one or more other processes, as illustrative examples. In an illustrative implementation, the 3D wirewound inductors 104, 204 correspond to high Q inductors (e.g., having a relatively large number of coils) that may be used in connection with a relatively high inductance application (e.g., a low band RF application), and the 2D inductors 402, 404 may be used in connection with a lower inductance application (e.g., a high band RF application).

In the example of FIG. 4, the 3D wirewound inductor 104 is coupled in parallel to the second 3D wirewound inductor 204. For example, FIG. 4 illustrates that the first metal region 120 of the capacitor 116 may be in contact with the 3D wirewound inductor 104 and the second 3D wirewound inductor 204. In other implementations, the 3D wirewound inductor 104 may be coupled to the second 3D wirewound inductor 204 via a series connection, via a magnetic coupling, or via another connection. In another example, the 3D wirewound inductor 104 is electrically isolated from (e.g., is not coupled to) the second 3D wirewound inductor 204.

The example of FIG. 4 illustrates that the device 400 may include one or more 3D wirewound inductors (e.g., the 3D wirewound inductors 104, 204) and one or more 2D inductors (e.g., the 2D inductors 402, 404). In an illustrative implementation, one or more 3D wirewound inductors may be used in connection with a relatively high-inductance application, and one or more 2D inductors may be used in connection with a lower-inductance application.

Figure 5:
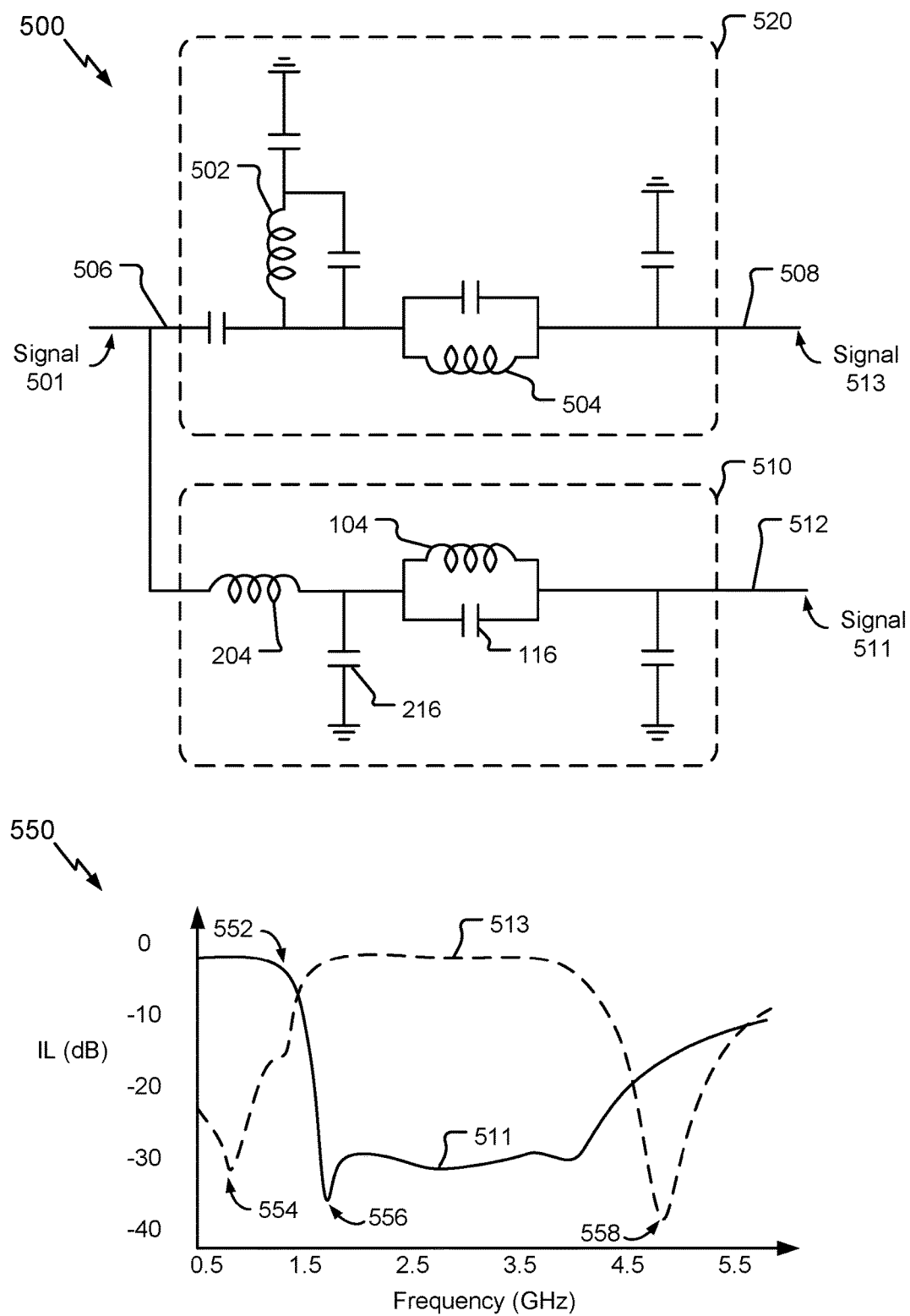
FIG. 5 depicts an illustrative example of a diplexer (DPX) circuit including a 3D wirewound inductor integrated within a substrate and an illustrative graph associated with operation of the DPX circuit.

FIG. 5 illustrates an example of a diplexer (DPX) circuit 500. One or more features of the DPX circuit 500 may be as described with reference to the device 100 of FIG. 1, the device 200 of FIG. 2, the device 300 of FIG. 3, the device 400 of FIG. 4, or a combination thereof. For example, the DPX circuit 500 may include the 3D wirewound inductor 104, the second 3D wirewound inductor 204, the capacitor 116, and the second capacitor 216. It is noted that one or more aspects described with reference to the DPX circuit 500 may be used in connection with one or more other circuits, such as a multiplexer (MPX) circuit, a triplexer (TPX) circuit, or another circuit.

The DPX circuit 500 may further include an inductor 502 and an inductor 504. In some implementations, one or both of the inductors 502, 504 correspond to 3D wirewound inductors integrated within the substrate 108 of FIGS. 1-4. Alternatively or in addition, one or both of the inductors 502, 504 may correspond to 2D inductors, such as the 2D inductors 402, 404 of FIG. 4.

The DPX circuit 500 may include a node 506. In some implementations, the node 506 is coupled to one or more antennas or to one or more amplifiers (e.g., one or more low noise amplifiers (LNAs)) that are responsive to one or more antennas. The DPX circuit 500 may further include a node 508 and a node 512. The nodes 508, 512 may be coupled to a set of antenna switches, as an illustrative example.

A first portion 510 of the DPX circuit 500 may correspond to a first filter, such as low-pass filter. A second portion 520 of the DPX circuit 500 may correspond to a second filter, such as a high-pass filter.

During operation, the node 506 may receive a signal 501, such as from an antenna coupled to the DPX circuit 500. The first portion 510 and the second portion 520 may filter signal components of one or more signals, such as the signal 501. The first portion 510 may generate a signal 511, and the second portion 520 may generate a signal 513. To illustrate, the signal 511 may correspond to a LB signal, and the signal 513 may correspond to an HB signal. The signal 511 may be associated with a first frequency range (e.g., a cellular frequency range), and the signal 513 may be associated with a second frequency range (e.g., a WiFi frequency range). In an illustrative example, the node 512 is configured to provide the signal 511 to one or more antenna switches, and the node 508 is configured to provide the signal 513 to one or more antenna switches.

To further illustrate, FIG. 5 includes a graph 550 that depicts illustrative examples of the signals 511, 513. In the graph 550, the abscissa indicates a frequency range of approximately 0.5 gigahertz (GHz) to 5.5 GHz, and the ordinate indicates intensity level (IL) in decibels (dB). In the example of FIG. 5, the DPX circuit 500 may include one or more filter circuits (e.g., a low-pass filter and a high pass filter) having a frequency range that is between 0.5 GHz and 5.5 GHz. It should be appreciated that the example of the graph 550 is illustrative and non-limiting and that other examples are also within the scope of the disclosure.

In the graph 550, the signals 511, 513 are associated with corner frequencies. For example, the signal 513 may be associated with a corner frequency 554 and a corner frequency 558. As another example, the signal 511 may be associated with a corner frequency 552 and a corner frequency 556. In an illustrative example, the corner frequency 552 is based on an inductance of the second 3D wirewound inductor 204, and the corner frequency 554 is based on an inductance of the inductor 502. The corner frequency 556 may be based on an inductance of the 3D wirewound inductor 104, and the corner frequency 558 may be based on an inductance of the inductor 504, as illustrative examples.

The example of FIG. 5 illustrates certain aspects that may improve operation of a circuit, such as a DPX circuit. For example, by using the 3D wirewound inductors 104, 204 in the first portion 510 of the DPX circuit 500, operation of the first portion 510 may be more similar to an "ideal" low-pass filter as compared to certain other devices (e.g., due to enhanced Q factors of the 3D wirewound inductors 104, 204). In this case, the signal 511 may contain fewer signal components associated with the signal 513, which may result in enhanced signal quality of the signal 511.

Figure 6:
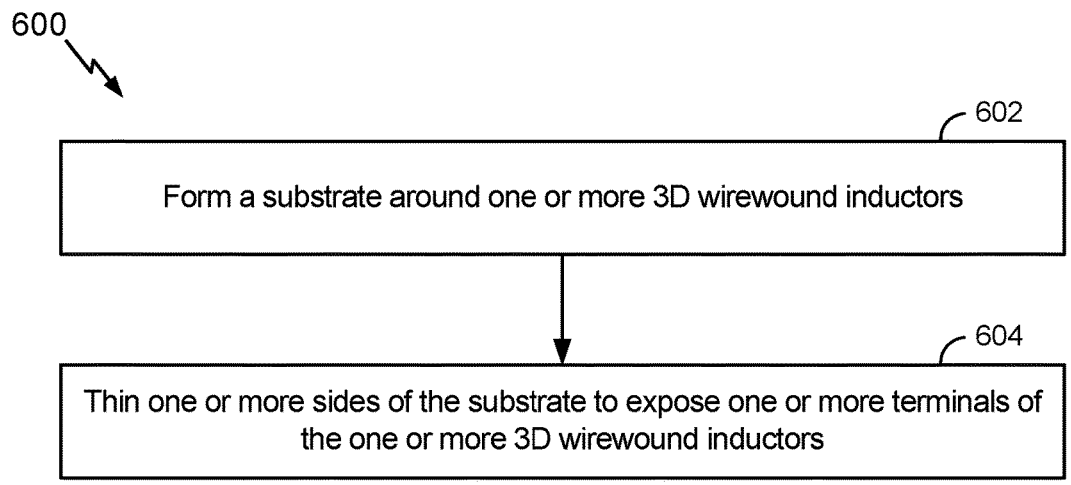
FIG. 6 is a flow diagram of an illustrative example of a method of fabrication of a device that include a 3D wirewound inductor integrated within a substrate.

FIG. 6 illustrates an illustrative example of a method 600 of fabrication of a device. For example, the method 600 may be performed during fabrication of the device 100 of FIG. 1, the device 200 of FIG. 2, the device 300 of FIG. 3, the device 400 of FIG. 4, the DPX circuit 500 of FIG. 5, or a combination thereof.

The method 600 includes forming a substrate around one or more 3D wirewound inductors, at 602. For example, the substrate 108 of FIGS. 1-4 may be formed around one or more of the 3D wirewound inductors 104, 204. In an illustrative implementation, the substrate 108 is formed using a molding process. For example, the molding process may include applying (e.g., pouring) a molten glass material around the one or more inductors and then solidifying the molten glass material to form the substrate.

During formation of the substrate, the one or more 3D wirewound inductors may be arranged on a dummy device (e.g., a dummy wafer). In an illustrative example, the one or more 3D wirewound inductors are attached to the dummy device using an adhesive material, such as adhesive tape. After formation of the substrate, the one or more 3D wirewound inductors may be de-taped from the substrate, and the dummy device may be separated from the substrate.

The method 600 further includes thinning one or more sides of the substrate to expose one or more terminals of the one or more 3D wirewound inductors, at 604. For example, thinning the one or more sides may include planarizing the substrate (e.g., using a chemical-mechanical planarization (CMP) process), grinding the substrate, or polishing the substrate, as illustrative examples. To further illustrate, thinning the one or more sides of the substrate may expose the first terminal 103 of the 3D wirewound inductor 104, the second terminal 105 of the 3D wirewound inductor 104, or both.

The method 600 may optionally include forming a capacitor, such as by performing a metal-insulator-metal (MIM) process to form a capacitor coupled to a particular 3D wirewound inductor of the one or more 3D wirewound inductors. For example, the capacitor 116 may be coupled to the 3D wirewound inductor 104. As another example, the second capacitor 216 may be coupled to the second 3D wirewound inductor 204. The capacitor may be formed above one of the particular wirewound inductor. To illustrate, the capacitor 116 may be formed above the 3D wirewound inductor 104, and the second capacitor 216 may be formed above the second 3D wirewound inductor 204. In some implementations, the MIM process is performed on one surface of the substrate, such as the first surface 109 of the substrate 108. In other implementations, the MIM process is performed on multiple surfaces of the substrate, such as the surfaces 109, 111 of the substrate 108.

The method 600 may optionally include performing a redistribution layer (RDL) process. For example, the RDL process may be performed to create the layer 202 of FIGS. 2-4. The RDL process may be performed on one surface of the substrate (e.g., the second surface 111 of the substrate 108) or on multiple surfaces of the substrate (e.g., the surfaces 109, 111 of the substrate 108).

The method 600 may optionally include performing a passivation process, performing a ball attachment process, or both. To illustrate, a passivation process may be performed to form the second layer 232, and the ball attachment process may be performed to attach the bump 140, the second bump 240, or both.

Figure 7:
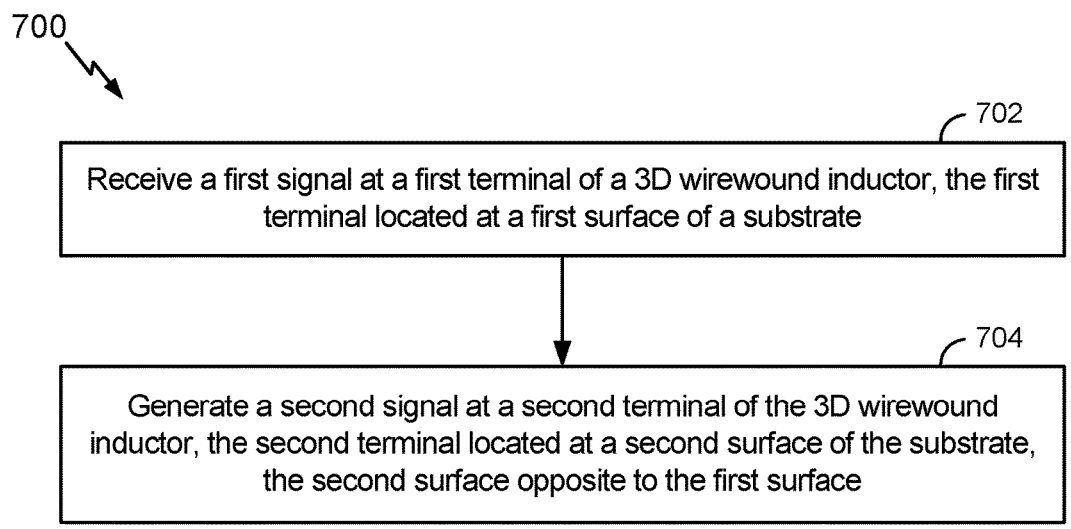
FIG. 7 is a flow diagram of an illustrative example of a method of operation of a device that include a 3D wirewound inductor integrated within a substrate.

FIG. 7 illustrates an illustrative example of a method 700 of operation of a device. For example, the method 700 may be performed during operation of the device 100 of FIG. 1, the device 200 of FIG. 2, the device 300 of FIG. 3, the device 400 of FIG. 4, the DPX circuit 500 of FIG. 5, or a combination thereof.

The method 700 includes receiving a first signal at a first terminal of a 3D wirewound inductor, at 702. The first terminal is located at a first surface of a substrate. For example, the first terminal 103 of the 3D wirewound inductor 104 may be located at the first surface 109 of the substrate 108. The signal may be received from the capacitor 116, as an illustrative example.

The method 700 further includes generating a second signal at a second terminal of the 3D wirewound inductor, at 704. The second terminal is located at a second surface of the substrate, and the second surface is opposite to the first surface. For example, the second terminal 105 of the 3D wirewound inductor 104 may be located at the second surface 111 of the substrate 108, and the second surface 111 may be opposite to the first surface 109.

Figure 8:
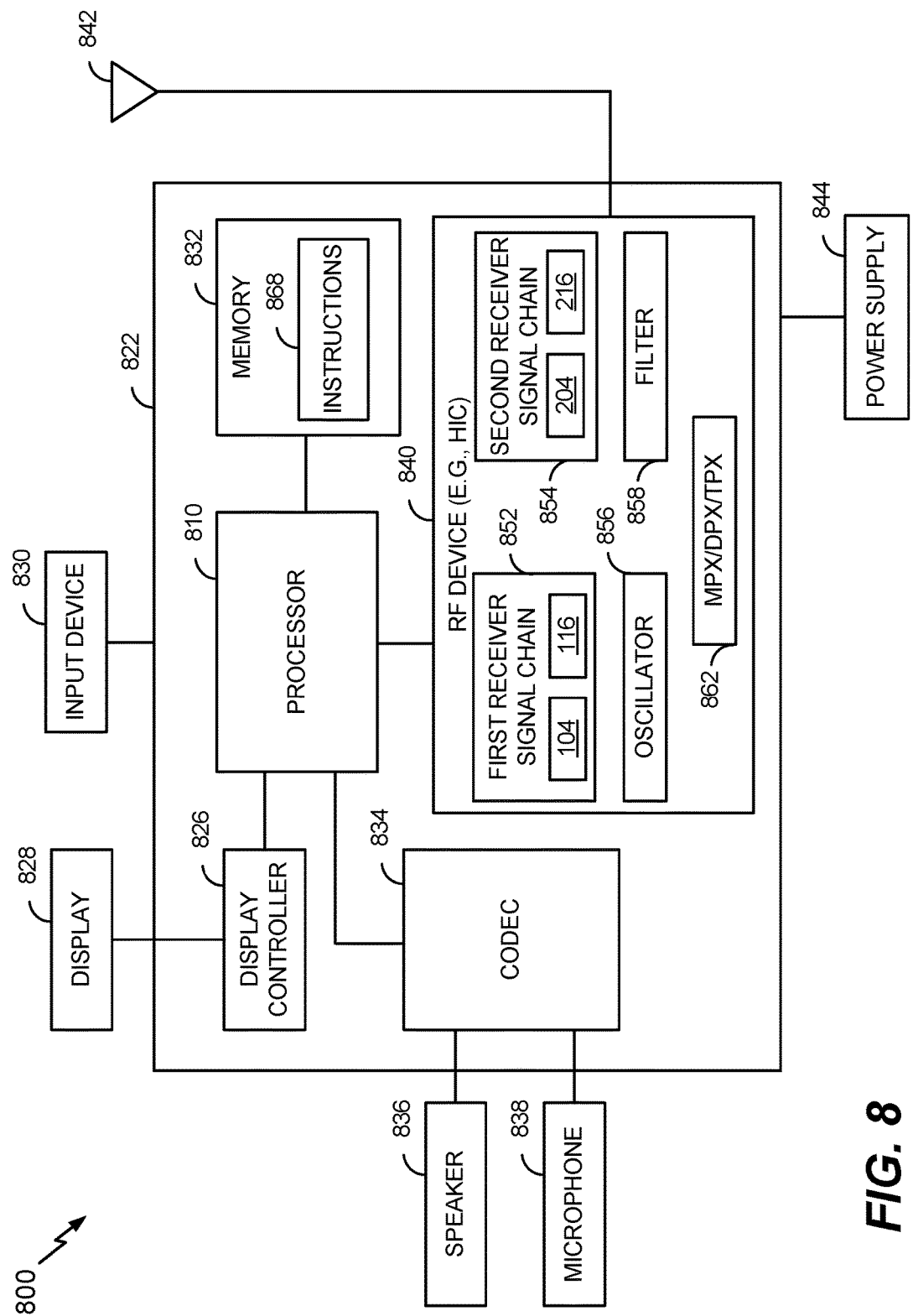
FIG. 8 is a block diagram of an illustrative example of an electronic device including a 3D wirewound inductor integrated within a substrate.

Referring to FIG. 8, a block diagram of a particular illustrative example of an electronic device is depicted and generally designated 800. The electronic device 800 may correspond to a mobile device (e.g., a cellular telephone), as an illustrative example. In other implementations, the electronic device 800 may correspond to a computer (e.g., a server, a laptop computer, a tablet computer, or a desktop computer), an access point, a base station, a wearable electronic device (e.g., a personal camera, a head-mounted display, or a watch), a vehicle control system or console, a home appliance, a set top box, an entertainment unit, a navigation device, a personal digital assistant (PDA), a television, a monitor, a tuner, a radio (e.g., a satellite radio), a music player (e.g., a digital music player or a portable music player), a video player (e.g., a digital video player, such as a digital video disc (DVD) player or a portable digital video player), a robot, a healthcare device, another electronic device, or a combination thereof.

The electronic device 800 includes a processor 810. The processor 810 may include a digital signal processor (DSP), a central processing unit (CPU), a graphics processing unit (GPU), another processing device, or a combination thereof.

The electronic device 800 may further include a memory 832. The memory 832 may be coupled to or integrated within the processor 810. The memory 832 may store instructions 868 that are executable by the processor 810. To further illustrate, the memory 832 may include random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), one or more registers, a hard disk, a removable disk, a compact disc read-only memory (CD-ROM), another storage device, or a combination thereof.

The electronic device 800 may further include a radio frequency (RF) device 840. The RF device 840 may correspond to an RF receiver front-end device, a hybrid integrated circuit (HIC), or both, as illustrative examples. In some implementations, the RF device 840 may be included in a first die (or an HIC) that is separate from a second die that includes one or more other components of the electronic device 800, such as the processor 810 and the memory 832. As an illustrative example, the first die (or HIC) may include a glass substrate corresponding to the substrate 108 of FIGS. 1-5, and the second die may include a semiconductor substrate. The first die (or HIC) and the second die may be included in a system-in-package (SiP) device or may be attached to a printed circuit board (PCB), as illustrative examples.

The RF device 840 may include one or more receiver signal chains, such as a first receiver signal chain 852 and a second receiver signal chain 854. FIG. 8 depicts that the first receiver signal chain 852 may include the 3D wirewound inductor 104 and the capacitor 116 and that the second receiver signal chain 854 may include the second 3D wirewound inductor 204 and the second capacitor 216.

To further illustrate, the first receiver signal chain 852 may correspond to a low-band receiver signal chain, and the second receiver signal chain 854 may correspond to a high-band receiver signal chain. In some implementations, the first receiver signal chain 852 corresponds to a cellular receiver signal chain, and the second receiver signal chain 854 corresponds to a WiFi receiver signal chain. At least one of the first receiver signal chain 852 and the second receiver signal chain 854 may be associated with a frequency range of approximately 0.5 GHz to 5.5 GHz, as illustrated in the example of the graph 550 of FIG. 5.

The RF device 840 may include an oscillator 856, a filter 858, and a circuit 862 that includes one or more of an MPX circuit, a DPX circuit (e.g., the DPX circuit 500 of FIG. 5), or a TPX circuit. It is noted that, depending on the particular application, one or more of the oscillator 856, the filter 858, and the circuit 862 may include one or more 3D wirewound inductors corresponding to the 3D wirewound inductor 104.

FIG. 8 also shows a display controller 826 that is coupled to the processor 810 and to a display 828. A coder/decoder (CODEC) 834 can also be coupled to the processor 810. A speaker 836 and a microphone 838 can be coupled to the CODEC 834. FIG. 8 also indicates that an antenna 842 may be coupled to the RF device 840.

In a particular example, the processor 810, the display controller 826, the memory 832, the CODEC 834, and the RF device 840 are included in or attached to an SiP or PCB device 822. Further, an input device 830 and a power supply 844 may be coupled to the SiP or PCB device 822. Moreover, in a particular example, as illustrated in FIG. 8, the display 828, the input device 830, the speaker 836, the microphone 838, the antenna 842, and the power supply 844 are external to the SiP or PCB device 822. However, each of the display 828, the input device 830, the speaker 836, the microphone 838, the antenna 842, and the power supply 844 can be coupled to a component of the SiP or PCB device 822, such as to an interface or to a controller. In some implementations, the RF device 840 may be integrated within a base station.

In conjunction with the described examples, an apparatus includes means (e.g., the 3D wirewound inductor 104) for conducting a signal through a set of one or more wirewound coils (e.g., the coil 106) to generate a magnetic field. The means for conducting the signal is integrated within a substrate, such as the substrate 108. The apparatus further includes means (e.g., the capacitor 116) for storing charge. The means for storing charge is coupled to the means for conducting the signal. The apparatus may optionally include means (e.g., the second 3D wirewound inductor 204) for conducting a second signal through a second set of one or more wirewound coils to generate a second magnetic field, where the means for conducting the second signal is integrated within the substrate. In an illustrative example, a first number of wirewound coils of the set of one or more wirewound coils is different than a second number of wirewound coils of the second set of one or more wirewound coils, such as depicted in the examples of FIGS. 2 and 4.

Figure 9:
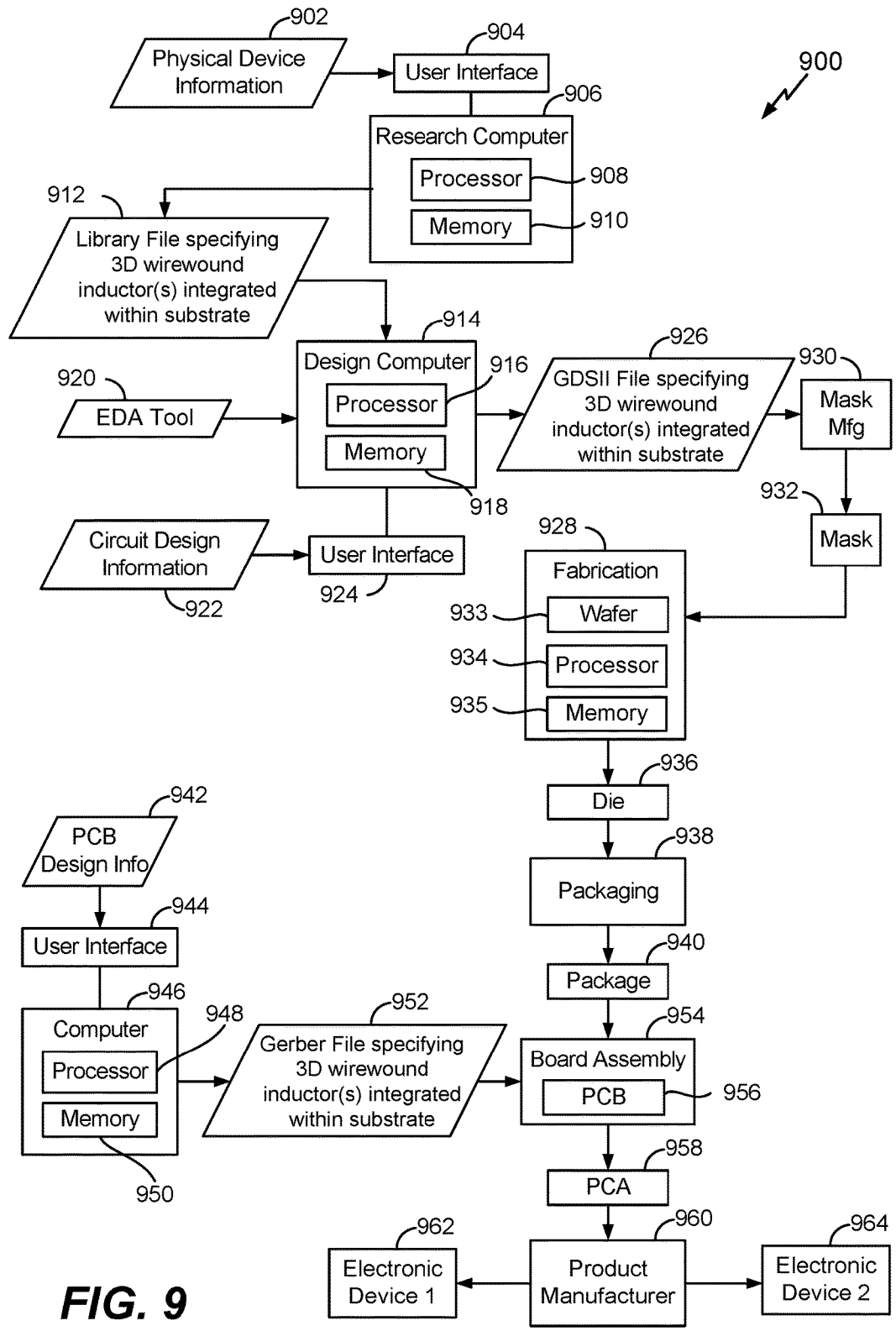
FIG. 9 is a data flow diagram of a particular illustrative embodiment of an electronic device manufacturing process to manufacture electronic devices that include a 3D wirewound inductor integrated within a substrate.

The foregoing disclosed devices and functionalities may be designed and represented using computer files (e.g. RTL, GDSII, GERBER, etc.). The computer files may be stored on computer-readable media. Some or all such files may be provided to fabrication handlers who fabricate devices based on such files. Resulting products include wafers that are then cut into die and packaged into integrated circuits (or "chips"). The chips are then employed in electronic devices, such as the electronic device 800 of FIG. 8. FIG. 9 depicts a particular illustrative example of an electronic device manufacturing process 900.

Physical device information 902 is received at the electronic device manufacturing process 900, such as at a research computer 906. The physical device information 902 may include design information representing at least one physical property of a device that includes a substrate including one or more 3D wirewound inductors, such as the 3D wirewound inductor 104, the second 3D wirewound inductor 204, or both. For example, the physical device information 902 may include physical parameters, material characteristics, and structure information that is entered via a user interface 904 coupled to the research computer 906. The research computer 906 includes a processor 908, such as one or more processing cores, coupled to a computer readable medium, such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may specify a library of devices (e.g., for use with an electronic design automation (EDA) tool 920) including a substrate having one or more 3D wirewound inductors, such as the 3D wirewound inductor 104, the second 3D wirewound inductor 204, or both.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including a substrate including one or more 3D wirewound inductors, such as the 3D wirewound inductor 104, the second 3D wirewound inductor 204, or both. For example, a user of the design computer 914 may enter circuit design information 922 via a user interface 924 coupled to the design computer 914. The circuit design information 922 may include design information representing at least one physical property of a substrate including one or more 3D wirewound inductors, such as the 3D wirewound inductor 104, the second 3D wirewound inductor 204, or both. To illustrate, the circuit design information 922 may identify particular circuits and relationships to other elements in a circuit design, positioning information, feature size information, interconnection information, or other information representing a physical property of a device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing a substrate including one or more 3D wirewound inductors, such as the 3D wirewound inductor 104, the second 3D wirewound inductor 204, or both, in addition to other circuits or information.

The GDSII file 926 may be received at a fabrication process 928 to manufacture a device that includes a substrate including one or more 3D wirewound inductors, such as the 3D wirewound inductor 104, the second 3D wirewound inductor 204, or both, according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process to generate one or more wafers 934, which may be tested and separated into dies, such as a representative die 936. The die 936 includes a substrate including one or more 3D wirewound inductors, such as the 3D wirewound inductor 104, the second 3D wirewound inductor 204, or both.

To further illustrate, a processor 933 and a memory 935 may initiate and/or control the fabrication process 928. The memory 935 may include executable instructions, such as computer-readable instructions or processor-readable instructions. The executable instructions may include one or more instructions that are executable by a processor, such as the processor 933. The processor 933 may execute the instructions to perform one or more operations described with reference to the method 600 of FIG. 6.

The fabrication process 928 may be implemented by a fabrication system that is fully automated or partially automated. For example, the fabrication process 928 may be automated according to a schedule. The fabrication system may include fabrication equipment (e.g., processing tools) to perform one or more operations to form a device. For example, the fabrication equipment may be configured to deposit one or more materials, epitaxially grow one or more materials, conformally deposit one or more materials, apply a hardmask, apply an etching mask, perform etching, perform planarization, and/or perform a wafer cleaning process, etc.

The fabrication system (e.g., an automated system that performs the fabrication process 928) may have a distributed architecture (e.g., a hierarchy). For example, the fabrication system may include one or more processors, such as the processor 933, one or more memories, such as the memory 935, and/or one or more controllers that are distributed according to the distributed architecture. The distributed architecture may include a high-level processor that controls or initiates operations of one or more low-level systems. For example, a high-level processor may include one or more processors, such as the processor 933, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component may include a processor, such as the processor 933.

Alternatively, the processor 933 may be a part of a high-level system, subsystem, or component of the fabrication system. In another embodiment, the processor 933 initiates or controls distributed processing operations associated with multiple levels and components of a fabrication system.

Thus, the processor 933 may include processor-executable instructions that, when executed by the processor 933, cause the processor 933 to initiate or control formation of a device. The device may include one or more materials formed using one or more doping tools, such as a molecular beam epitaxial growth tool, a flowable chemical vapor deposition (FCVD) tool, a conformal deposition tool, and/or a spin-on deposition tool. During fabrication of the device, one or more materials may be removed (e.g., etched) from the device using one or more removal tools, such as a chemical removal tool, a reactive gas removal tool, a hydrogen reaction removal tool, a planarization tool, and/or a standard clean 1 type removal tool.

The executable instructions included in the memory 935 may enable the processor 933 to initiate or control formation of a device or structure described herein. For example, the executable instructions may enable the processor 933 to initiate or control formation of the substrate 108, such as using a molding process. The die 936 may include the substrate 108 and one or more 3D wirewound inductors integrated within the substrate 108, such as the 3D wirewound inductor 104, the second 3D wirewound inductor 204, or both. The die 936 may have a passive-on-glass (PoG) configuration.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards. In some implementations, the package 940 includes one or more of the device 100, the device 200, the device 300, the device 400, or the DPX circuit 500.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged device on a circuit board. The packaged device may correspond to the package 940, and the package 940 may include a substrate including one or more 3D wirewound inductors, such as the 3D wirewound inductor 104, the second 3D wirewound inductor 204, or both.

The computer 946 may be configured to transform the PCB design information 942 to generate a data file, such as a GERBER file 952, with data that includes physical positioning information of a packaged device on a circuit board, as well as layout of electrical connections such as traces and vias. The packaged device may correspond to the package 940 and may include a substrate including one or more 3D wirewound inductors, such as the 3D wirewound inductor 104, the second 3D wirewound inductor 204, or both. In other embodiments, the data file generated by the transformed PCB design information may have a format other than a GERBER format.

The GERBER file 952 may be received at a board assembly process 954 and may be used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a mobile device, a computer, a set top box, a music player, a video player, an entertainment unit, a navigation device, a communications device, a personal digital assistant (PDA), or a "fixed" location data device (e.g., a base station). As another illustrative, non-limiting example, one or more of the electronic devices 962 and 964 may include mobile phones, hand-held personal communication systems (PCS) units, portable data units such as personal data assistants, global positioning system (GPS) enabled devices, navigation devices, "fixed" location data devices such as base stations and meter reading equipment, or any other device that stores or retrieves data or computer instructions, or any combination thereof. It should be appreciated that the disclosure is not limited to these illustrated devices.

A device that includes a substrate including one or more 3D wirewound inductors, such as the 3D wirewound inductor 104, the second 3D wirewound inductor 204, or both, may be fabricated, processed, and incorporated into an electronic device, as described in the electronic device manufacturing process 900. One or more aspects of the embodiments disclosed with respect to FIGS. 1-9 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. Although various representative stages of production from a physical device design to a final product are depicted, in other embodiments fewer stages may be used or additional stages may be included. Similarly, the electronic device manufacturing process 900 may be performed by a single entity or by one or more entities performing various stages of the electronic device manufacturing process 900.

Those of skill would further appreciate that the various illustrative logical blocks, configurations, modules, circuits, and algorithm steps described in connection with the examples disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the examples disclosed herein may be embodied directly in hardware, in a software module executed by a processor, or in a combination of the two. For example, one or more operations of the methods 600, 700 may be initiated, controlled, or performed by a field-programmable gate array (FPGA) device, an application-specific integrated circuit (ASIC), a processing unit such as a central processing unit (CPU), a digital signal processor (DSP), a controller, another hardware device, a firmware device, or a combination thereof. A software module may reside in random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transitory storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed examples is provided to enable a person skilled in the art to make or use the disclosed examples. Various modifications to these examples will be readily apparent to those skilled in the art, and the principles defined herein may be applied to other examples without departing from the scope of the disclosure. Thus, the present disclosure is not intended to be limited to the examples shown herein but is to be accorded the widest scope possible consistent with the principles and novel features as defined by the following claims.

What is claimed is:

1. An apparatus comprising:
   a substrate;
   a first three-dimensional (3D) wirewound inductor integrated within the substrate and including a first number of coils;
   a second 3D wirewound inductor integrated within the substrate and including a second number of coils that is different than the first number of coils; and
   a capacitor coupled to the first 3D wirewound inductor.

2. The apparatus of claim 1, wherein the substrate has a first surface and a second surface that is opposite to the first surface, and wherein the first 3D wirewound inductor includes one or more coils disposed around an axis extending from the first surface to the second surface.

3. The apparatus of claim 1, wherein the first number is greater than one.

4. The apparatus of claim 1, further comprising:
   a first receiver signal chain that includes the first 3D wirewound inductor; and
   a second receiver signal chain that includes the second 3D wirewound inductor.

5. The apparatus of claim 4, wherein the first receiver signal chain corresponds to a low-band receiver signal chain, and wherein the second receiver signal chain corresponds to a high-band receiver signal chain.

6. The apparatus of claim 4, wherein the first receiver signal chain corresponds to a cellular receiver signal chain, and wherein the second receiver signal chain corresponds to a WiFi receiver signal chain.

7. The apparatus of claim 4, wherein at least one of the first receiver signal chain and the second receiver signal chain is associated with a frequency range of approximately 0.5 gigahertz (GHz) to 5.5 GHz.

8. The apparatus of claim 1, wherein the first 3D wirewound inductor has a surface-mount technology (SMT) configuration.

9. The apparatus of claim 1, further comprising a two-dimensional (2D) inductor coupled to the first 3D wirewound inductor.

10. The apparatus of claim 1, wherein the first 3D wirewound inductor has a monolithic configuration.

11. The apparatus of claim 10, wherein the substrate has a monolithic configuration that is molded about the first 3D wirewound inductor.

12. The apparatus of claim 1, wherein the first 3D wirewound inductor has a helical configuration.

13. The apparatus of claim 1, wherein the substrate includes a glass material molded around and in contact with the first 3D wirewound inductor.

14. The apparatus of claim 13, wherein the glass material includes a solidified molten glass material.

15. An apparatus comprising:
   a substrate;
   a three-dimensional (3D) wirewound inductor integrated within the substrate;
   a capacitor coupled to the 3D wirewound inductor; and
   a radio frequency (RF) device that includes the 3D wirewound inductor and the capacitor, wherein the RF device includes at least one of a multiplexer circuit, a diplexer circuit, a triplexer circuit, a filter circuit, a hybrid circuit, or an RF receiver front-end circuit.

16. The apparatus of claim 15, wherein the capacitor has a planar configuration and is in contact with the 3D wirewound inductor at a surface of the substrate.

17. The apparatus of claim 15, wherein the RF device includes the filter circuit, and wherein the filter circuit is associated with a frequency range of between 0.5 gigahertz (GHz) and 5.5 GHz.

18. The apparatus of claim 15, wherein the RF device further includes an oscillator circuit that includes the 3D wirewound inductor and the capacitor.

19. The apparatus of claim 15, wherein the 3D wirewound inductor has a helical configuration.

20. The apparatus of claim 15, further comprising a second inductor.

21. The apparatus of claim 20, wherein the second inductor has a 3D wirewound configuration.

22. The apparatus of claim 20, wherein the 3D wirewound inductor has a first number of coils, and wherein the second inductor includes a second number of coils that is different than the first number.

23. The apparatus of claim 20, wherein the second inductor is integrated within the substrate.

24. An apparatus comprising:
   means for conducting a first signal through a first set of one or more wirewound coils to generate a magnetic field, the means for conducting the first signal integrated within a substrate;
   means for conducting a second signal through a second set of one or more wirewound coils to generate a second magnetic field, the means for conducting the second signal integrated within the substrate; and
   means for storing charge, the means for storing charge coupled to the means for conducting the first signal.

25. The apparatus of claim 24, wherein a first number of wirewound coils of the first set of one or more wirewound coils is different than a second number of wirewound coils of the second set of one or more wirewound coils.

26. A method of fabrication of a device, the method comprising:
   using a molding process, forming a substrate around one or more three-dimensional (3D) wirewound inductors, wherein the molding process includes applying a molten glass material about the one or more 3D wirewound inductors and solidifying the molten glass material; and
   thinning one or more sides of the substrate to expose one or more terminals of the one or more 3D wirewound inductors.

27. The method of claim 26, further comprising performing a metal-insulator-metal (MIM) process to form a capacitor coupled to a particular 3D wirewound inductor of the one or more 3D wirewound inductors.

28. The method of claim 27, wherein the capacitor is formed above the particular wirewound inductor.

* * * * *